United States Patent
Koyama et al.

[11] Patent Number: 6,143,382
[45] Date of Patent: Nov. 7, 2000

[54] GLASS SUBSTRATE HAVING FINE HOLES

[75] Inventors: Tadashi Koyama; Keiji Tsunetomo; Hideki Imanishi, all of Osaka, Japan

[73] Assignee: Nippon Sheet Glass Co., Ltd., Osaka, Japan

[21] Appl. No.: 09/088,863

[22] Filed: Jun. 2, 1998

[30] Foreign Application Priority Data

Jun. 4, 1997 [JP] Japan ................................. 9-145673

[51] Int. Cl.[7] .......................... C03C 21/00; C03C 23/00
[52] U.S. Cl. ................. 428/34.4; 65/61; 216/11; 216/24; 264/400; 359/350; 359/900; 428/36.9; 428/131; 428/434
[58] Field of Search .................. 428/131, 34.4, 428/434, 36.91; 264/400; 219/121.7, 121.71, 121.72; 359/350, 900; 216/11, 24; 65/61

[56] References Cited

U.S. PATENT DOCUMENTS

| 5,325,230 | 6/1994 | Yamagata et al. ............... 359/350 |
| 5,910,256 | 6/1999 | Tsunetomo et al. ............... 216/24 |
| 5,951,731 | 9/1999 | Tsunetomo et al. ............... 65/61 |

FOREIGN PATENT DOCUMENTS

| 54-28590 | 3/1979 | Japan. |
| 62-128794 | 6/1987 | Japan. |

*Primary Examiner*—Ellis Robinson
*Assistant Examiner*—Sandra M. Nolan
*Attorney, Agent, or Firm*—Merchant & Gould P.C.

[57] ABSTRACT

A glass substrate having fine holes formed therein by use of a laser beam without cracks or fragmentation occurring. A glass substrate is used in which silver is contained in the form Ag atoms, Ag colloid or Ag ions, to a predetermined depth from a surface of the glass, and further the concentration gradient of the silver is a maximum at one side surface on which the fine hole machining is performed and gradually decreases toward the other side surface, whereby ablation and evaporation occurs from the surface having the maximum concentration of silver layer by layer without causing cracking or fragmentation.

21 Claims, 9 Drawing Sheets

(a)

100μm (b)

100μm (a)

(b) Fine Hole (Penetrating Hole)

GLASS SUBSTRATE HAVING FINE HOLES

BACKGROUND OF THE INVENTION

1. Field of the Invention

The present invention relates to a glass substrate (of various shapes, including plate-like and not plate-like, for example, rod-like) having a plurality of fine hole(s) therein, applicable to various technical fields, including providing guide holes for use in the mounting of fibers in the field of optical communication, or providing holes for use in ink injection in the field of printers.

2. Description of Related Art

A substrate having a plurality of fine or minute holes therein has already been put to practical use comprising various materials, such as polyimide, or Teflon (trade mark of polytetrafluoroethylene), and such substrates are now used in several practical applications, providing contact holes for making electrical connection between layers in a multilayer printed circuit board, providing ejecting openings for inkjet printers, and providing holes for insertion of fibers for a fiber array, among others.

The holes used for the applications mentioned above have a diameter from several tens of $\mu$m to several hundreds of $\mu$m, and the holes are formed using a laser beam in most cases. For the laser beam, there is used infrared laser beam produced by, for example, a $CO_2$ laser, or a laser covering from the near-infrared region to the visible region, or further covering the ultraviolet region, by use of a Nd-YAG laser or by combining a Nd-YAG laser and a wavelength converter. Also, there is used a laser machining device using an excimer laser employing KrF (wavelength: 248 nm).

In addition, among various kinds of glass, a silicate glass containing mainly $SiO_2$ shows superior chemical stability and is also stable at high-temperature. Therefore, this glass can be applied to a large number of uses with the fine holes being formed therein by microscopic machining.

For performing the machining of such fine holes on the above-mentioned silicate glass, generally, they are machined by use of the laser beam mentioned above, or by a wet etching process using an etchant, such as fluoric acid, or by using a drill.

However, in the wet etching treatment, there are problems in that cylindrical shape holes cannot be obtained. Also, there are problems in the care and treatment of the etchant, and when machining the holes by using a drill, there is a limit to forming fine holes of around a diameter of 0.5 mm, as taught by Japanese Patent Laid-Open No. Sho 62-128794 (1987). Therefore, it is difficult to form a very fine or minute hole beyond that limit.

Additionally, trials have been performed by applying a laser beam to the microscopic machining of glass, as disclosed in Japanese Laid-Open Patent No. Sho 62-128794 (1987). However, the glass is inherently a fragile material, and cracks are easily caused therein when it is machined. In particular, even when using a KrF excimer laser in the ultraviolet region (wavelength 248 nm), cracks occur around irradiation marks or traces, and further the hole cannot be finished with a smooth interior wall. Therefore, a substrate having fine holes of sufficient quality cannot be formed.

Also, a technology was proposed which is disclosed in Japanese Laid open Patent No. Sho 54-28590 (1979). In this prior art, the glass is heated at 300–700° C. prior to being machined by irradiation of a laser beam thereon, so that it can withstand the thermal shock caused during the machining.

However, as mentioned in the above, if performing the microscopic machining on the glass with a laser beam under such conditions so that the thermal stress is relieved, since thermal shrinking occurs, it is impossible to maintain accuracy in machining in the order from micrometers to sub-micrometers. Further, a complicated device is necessitated for irradiating the laser beam on the glass under the condition that it is heated. Therefore, this process is not realistic from the viewpoint of efficient manufacturing.

Consequently, it is important to obtain a method of forming a glass substrate with fine holes therein, each of which has a smooth interior surface without cracks around the opening thereof, and that can be obtained without using means such as the heating mentioned above.

As a result, the inventors tried to irradiate a laser beam on common photosensitive glass which contains Ag ions in a uniform concentration therein. Explaining the process thereof by referring to FIGS. 1(a) to (d), as shown in FIG. 1(a), the laser beam was irradiated upon the glass substrate and entered into the inside thereof, and as shown in FIG. 1(b), the laser beam energy resolves the Ag ion residing inside thereof, thereby producing colloid (amicron of Ag). In forming the colloid, the coefficient of absorption of the laser beam was increased greatly as shown in FIG. 1(c), and then abrasion occurred from the inside thereof. Finally, as shown in FIG. 1(d), a concave portion was formed which is similar to cracking or fragmenting. Therefore, the process for forming the holes was stopped.

SUMMARY OF THE INVENTION

For resolving the problems mentioned above, in accordance with the present invention, there is provided a glass substrate having at least one fine hole therein, wherein silver is contained in the glass substrate before machining, in the form of any one of Ag atoms, Ag colloid or Ag ions, to a predetermined depth from a surface thereof, and further the concentration gradient of the silver is a maximum at the surface and gradually decreases to a predetermined depth.

Moreover, the distribution of the silver ions can be confirmed at the side surface of the fine hole which is formed by the laser machining.

Further, in accordance with the present invention, thereof, there is provided a glass substrate having at least one fine hole therein, wherein silver is contained throughout the glass substrate as a whole, in a form of any one of Ag atoms, Ag colloid or Ag ions, wherein a concentration gradient of the silver is such that, in a direction of thickness, it is a minimum value (including 0 mol %) at a middle portion thereof, and gradually increases towards the outside thereof.

In the same manner mentioned above, the distribution of the silver ions can be confirmed at the side surface of the fine hole which is formed by the laser machining.

Further, in accordance with the present invention, thereof, there is provided a glass substrate having at least one fine hole therein, wherein silver is contained throughout the glass substrate as a whole, in a form of any one of Ag atoms, Ag colloid or Ag ions, wherein a concentration gradient of the silver is a maximum value at the surface on which the laser machining is performed and gradually decreases toward opposite sides thereof.

In the same manner mentioned above, the distribution of the silver ions can be confirmed on the side surface of the fine hole which is formed by the laser machining.

Moreover, the glass substrate having at least one fine hole therein, in accordance with the present invention, can be formed in any configuration, including not only a plate-like but also a cylinder-like shape, and it preferably is to be made of silicate glass which mainly contains $SiO_2$, since it shows high transparency.

As a means for introducing the silver into the glass so as to have a suitable concentration gradient therein, an ion exchange process wherein Ag ions are exchanged with positive monovalent ions other than Ag ions is conceivable, for example. Further, if the silver concentration is low, then absorption of the laser beam also becomes low, and thereby evaporation and abrasion of the substrate material occurs only weakly. Therefore, it is preferable that the portion to be machined contains a silver concentration greater than 0.1 mol %.

In addition, for forming a penetrating through hole in the glass substrate, as shown in FIG. 2(a), a laser beam is irradiated upon a surface thereof having the highest silver concentration. Then, as shown in FIG. 2(b), the silver (Ag ions) in the glass surface where the silver concentration is at the highest value are resolved to be turned into colloid (amicron of Ag), which absorbs the energy of the laser beam. As shown in FIG. 2(c), the absorbed energy causes melting, evaporation and ablation to remove the surface layer glass. When the surface layer glass has been removed, the same phenomenon occurs in the glass in the layer immediately below that, and finally as shown in FIG. 2(d), a penetrating hole is formed, whereby it is possible to obtain a glass substrate having fine holes without cracks.

Furthermore, with the direction of irradiation of the laser beam as shown in FIG. 3(a), forming of the fine holes can be done from a side surface opposite to that which has the highest silver concentration. In this case, as shown in FIGS. 3(b) through 3(d), the silver (Ag ions) in the glass surface where the silver concentration is at the highest value is resolved to be turned into colloid (amicron of Ag), which absorbs the energy of the laser beam, and the surface layer glass is removed by the melting, evaporation and ablation. When the surface layer glass has been removed, the same phenomenon occurs in the glass in the layer immediately below that, and finally a concave or a penetrating hole is formed. Thereby, it is also possible to obtain a glass substrate having fine holes without cracks.

Further, as a means for producing the silver colloid, other than by irradiation with a laser beam, an ultraviolet beam can instead be employed. However, since no ablation or the like can be caused by the irradiation of a ultraviolet beam, a laser beam must be irradiated on the glass substrate afterwards to form the holes, etc.

Moreover, in place of the irradiation by the ultraviolet beam and the laser beam, the colloid can be formed by heating.

DESCRIPTION OF THE PREFERRED EMBODIMENTS

Hereinafter, a detailed explanation of the embodiments according to the present invention will be given by referring to the attached drawings.

EXAMPLE 1

Figure 1:
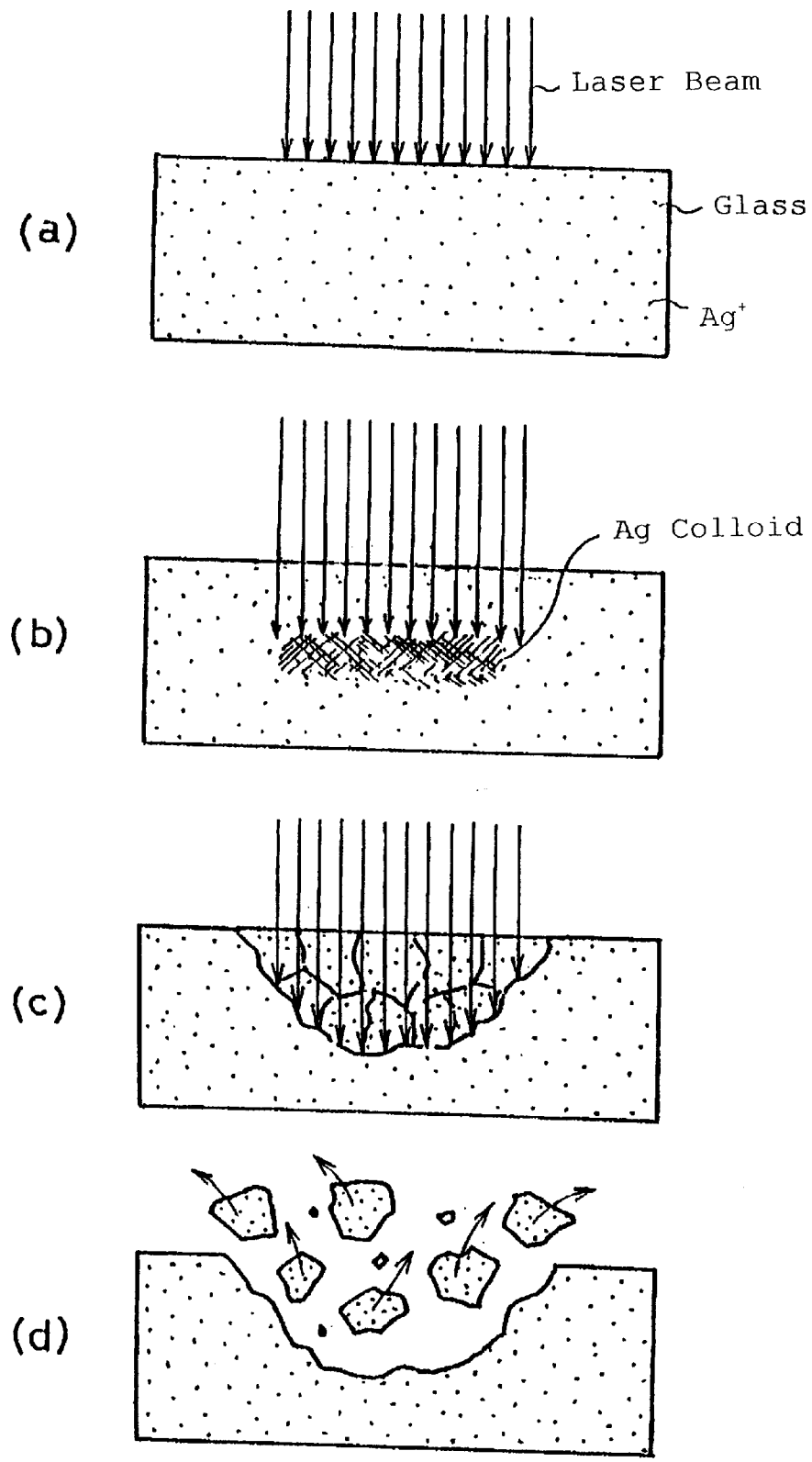
FIGS. 1(a) through 1(d) show processes of irradiating a laser beam on a photosensitive glass containing Ag ions therein at a uniform concentration.
Figure 2:
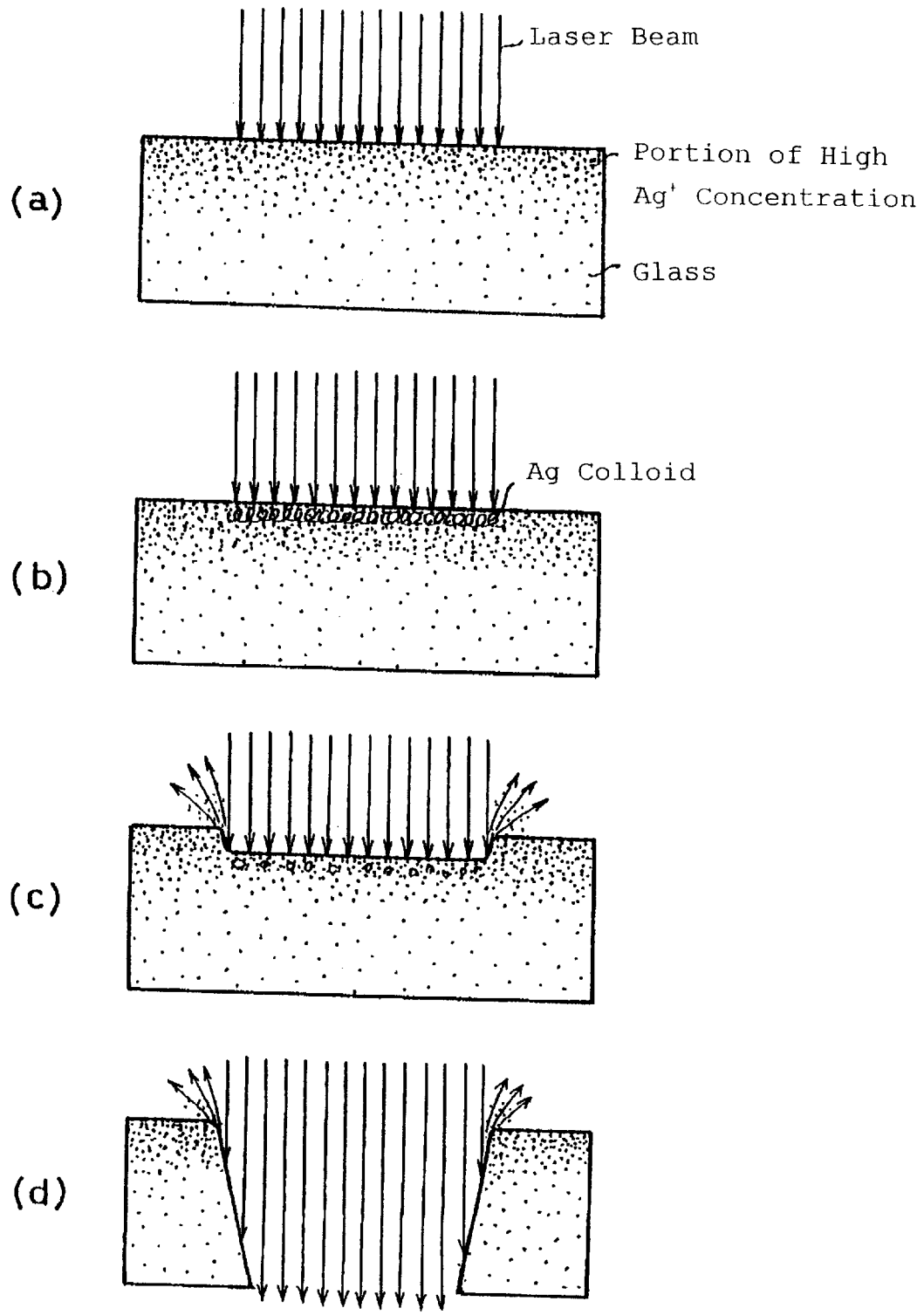
FIGS. 2(a) through 2(d) show processes of irradiating a laser beam on a glass substrate for laser machining in accordance with the present invention.
Figure 3:
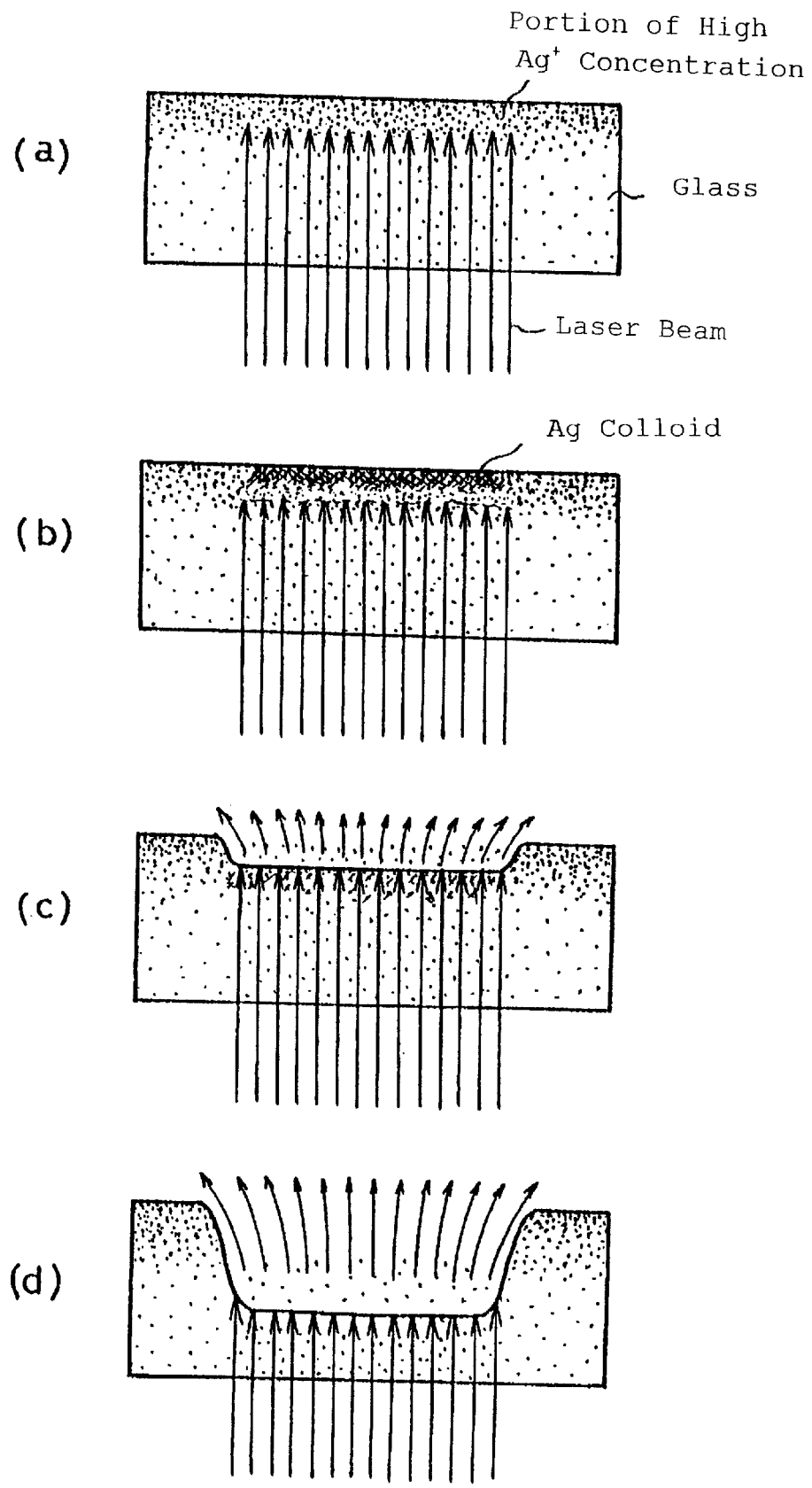
FIGS. 3(a) through 3(d) show processes in the same manner as in FIGS. 2(a) through (d) with a different direction of irradiation of the laser beam.
Figure 4:
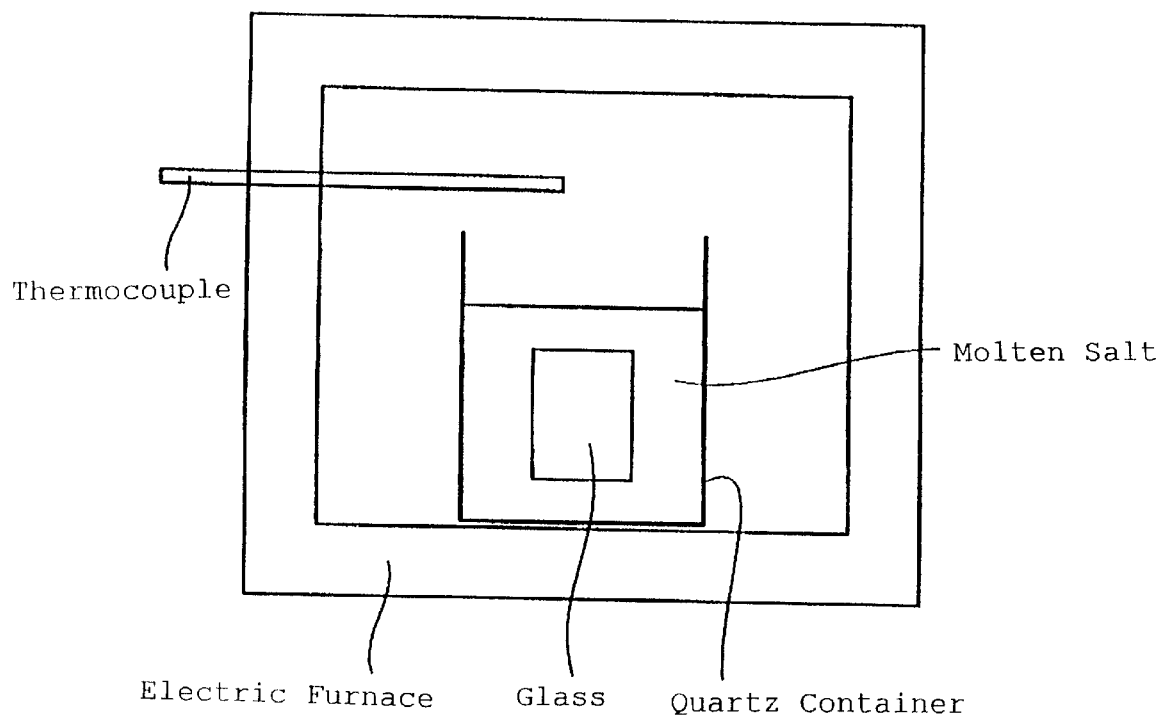
FIG. 4 shows a schematic diagram of an apparatus for use in ion exchanging.

Ion exchange is conducted on a glass material for producing a glass substrate having a plurality of fine hole(s), by using the apparatus shown in FIG. 4. As the glass substrate for use in machining a silicate glass which mainly contains $SiO_2$ and also contains $Al_2O_3$, $B_2O_3$, $Na_2O$ and F, etc., is used, having a thickness of 0.1 mm. A quartz container is filled with a mixture of silver nitrate and sodium nitrate at a ratio of 50 mol %–50 mol %, as a molten or fused salt.

Then the glass substrate for use in machining is dipped in the molten salt in the quartz container for six (6) hours. Moreover, the temperature of the molten salt is kept at 300° C. by an electric furnace, and the reacting atmosphere is air.

By the process mentioned above, Na ions (the positive ion of a monovalent element) in the glass surface are extracted, and Ag ions in the molten salt are diffused into the glass. Measuring the thickness of the layer into which the Ag ions are diffused with an X-ray microanalyzer, the layer was determined to be about 30 μm thick, after a treatment time of six (6) hours.

Next, a laser beam is irradiated onto the glass to remove a specific portion of the glass by evaporation or ablation, to thereby form a penetrating hole. The laser beam which is used for this machining (hole forming) process is the light beam of a third high harmonic of an Nd:YAG laser, having a wavelength of 355 nm. This laser has a pulse width of about 10 nsec and has a repetition frequency of 5 Hz, and the laser beam which is emitted is narrowed by a lens prior to irradiation. Furthermore, the glass shows little absorption at the wavelength of 355 nm.

The spot size of the irradiated light beam is set to 500 μm, and the energy is 39 $J/cm^2$.

Figure 5:
FIGS. 5(a) and 5(b) show a photo of a concave formed in the glass substrate in accordance with the present invention,
observed by a microscope, and a drawing made on the basis of the same photo.
Figure 5:
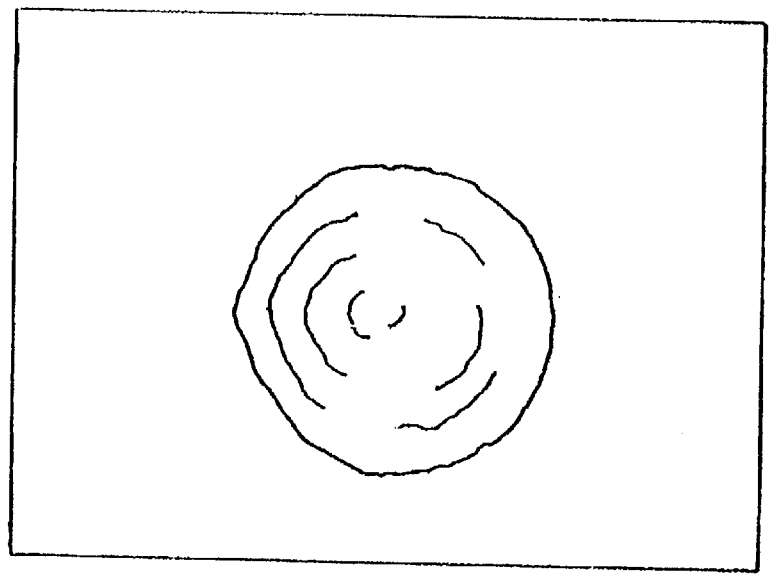
Figure 6:
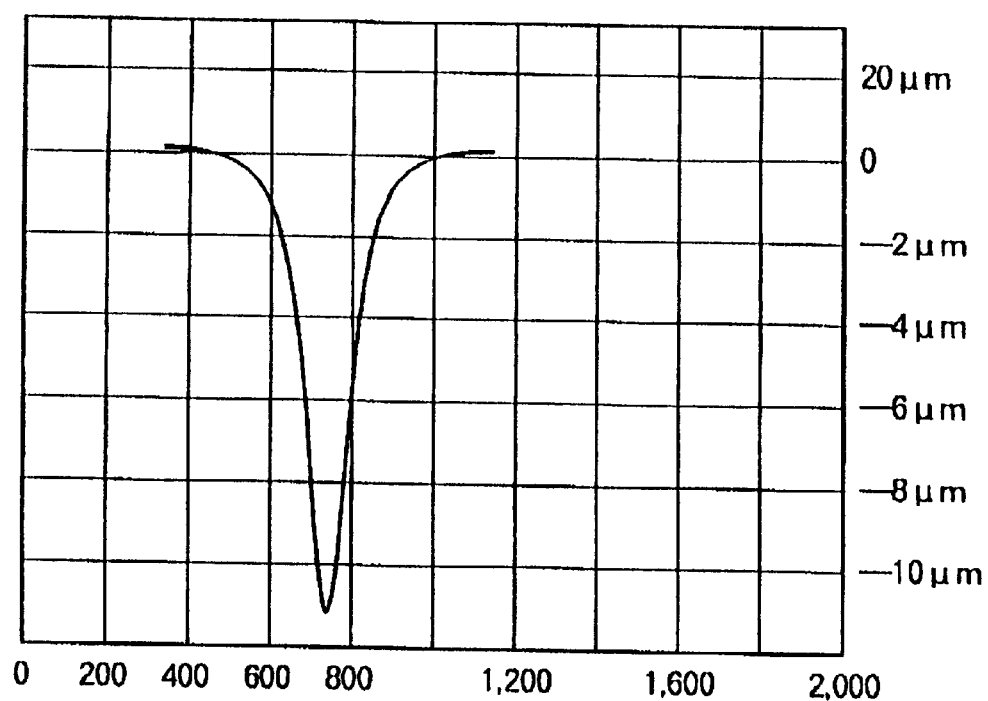
FIG. 6 shows the graph of the result of measuring the concave formed in the glass substrate in accordance with the present invention by a surface roughness detector of a proven type.

First of all, thirty (30) repetitions of laser pulses are irradiated. After the irradiation, a concave cavity of a depth about 10 μm is formed on the glass surface. FIG. 5(a) shows a photo of the concave cavity so formed, observed by a microscope. FIG. 5(b) is a drawing made on the basis of the same photo, and FIG. 6 shows the graph of the result of measuring at the position where the irradiation is made by a surface roughness detector of a proven type. From those figures, it can be seen that no cracking nor fragmenting can be observed around the point of the irradiation, and the trace of the irradiation is also smooth. Thereby, it appears that a smooth gradient can be obtained. This result does not depend on the time for the ion exchange process.

Making the spot size 100 $\mu$m, the irradiation is repeated until it penetrates through the glass under the same conditions. As a result, a hole can be obtained which is as large as 100 $\mu$m at the entrance side and 70 $\mu$m at the exit side. Also in this case, no fragmentation occurs in the vicinity of the surface and a good or satisfactory penetrating hole can be obtained. By moving a support stage upon which the glass substrate is positioned stepwise and linearly, and by forming a new penetrating hole each time that it is moved, an array of penetrating holes aligned in one dimension can be obtained. Further, by additionally moving the stage in a direction which is normal to the previous linear direction, an array of two dimensions can be obtained in the same manner.

Figure 7:
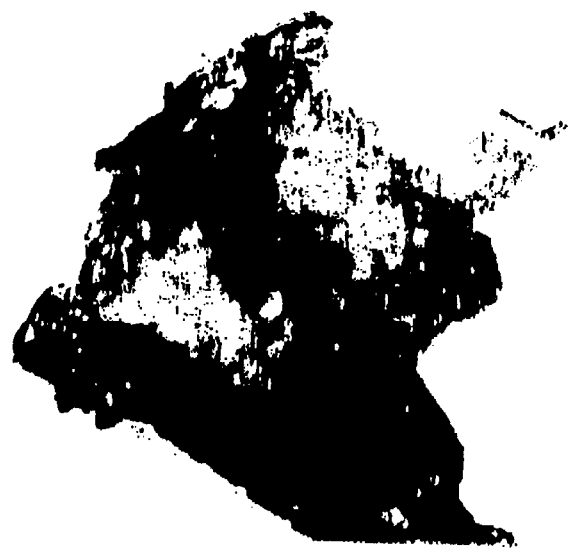
FIGS. 7(a) and 7(b) show a photo of a concave formed in the glass substrate without being treated by ion exchange, observed by a microscope, and a drawing made on the basis of the same photo.
Figure 7:
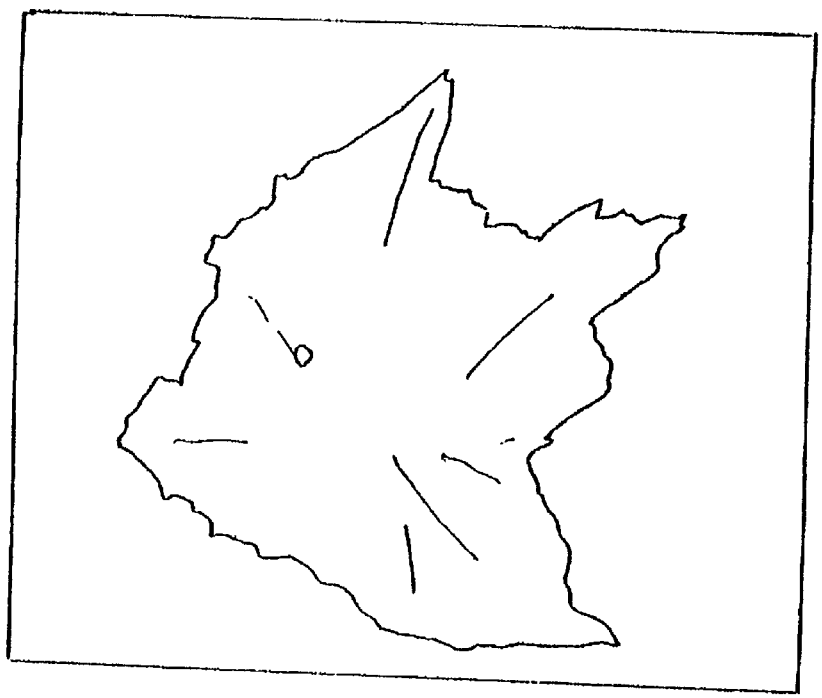

On the other hand, the laser beam was also irradiated onto a glass substrate which was not treated with the ion exchange process as described above. FIG. 7(a) shows a photo of a concave cavity thus formed, observed by a microscope, and FIG. 7(b) shows a drawing made on the basis of the same photo. As is apparent from those figures, cracks occurred hard in the portion around the irradiation point, and a fine and irregular unevenness was caused on the irradiated surface, thus creating a rough or sandy surface. It is thereby impossible to obtain the desired smooth surface. Further, measurement by the surface roughness detector of proven type was impossible because of the irregularities and roughness thereof.

As is described above, with the surface of glass which is treated by the ion exchange process, it is possible to obtain a glass substrate having a plurality of satisfactory fine holes formed therein. On the side surface of the hole or in the concave cavity, the distribution of silver ions is as described in the claims.

Comparison 1

Onto a glass substrate which has the same composition as that used in Embodiment 1 but was not treated by the ion exchange process described above, a laser beam of an excimer laser having a wavelength 248 nm is irradiated so as to try to form a penetrating hole. As a result, however, cracks and fragmentation occurred and it was, therefore, impossible to form a satisfactory penetrating hole.

Embodiment 2

Ion exchange is conducted in a glass material for producing a glass substrate having a plurality of fine hole(s) by using the apparatus shown in FIG. 4. A silicate glass is used, which mainly contains $SiO_2$ and also contains $Al_2O_3$, $B_2O_3$, $Na_2O$ and F, etc., and has a thickness of 0.1 mm. A quartz container is filled with a mixture of silver nitrate and sodium nitrate at a ratio of 50 mol %–50 mol %, as a molten or fused salt.

Then the glass substrate for use in machining is dipped in the molten salt in the quartz container for seventy-two (72) hours. Moreover, the temperature of the molten salt is kept at 300° C. by an electric furnace, and the reacting atmosphere is air.

Measuring the thickness of a layer into which the Ag ions are diffused by an X-ray micro-analyzer, it was found to reach to the center of the substrate, and the concentration thereof is higher at both surfaces of the substrate.

Forming penetrating holes under the same conditions as those in Embodiment 1, the same results can be obtained, i.e., an array of satisfactory penetrating holes is obtained.

As is mentioned above, with the surface which is treated by the ion exchange process, it is possible to obtain a glass substrate having satisfactory plural fine holes formed therein. On the side surface of the hole, the distribution of the silver ions is as described in the claims.

Embodiment 3

Ion exchange is conducted on a glass material for producing a glass substrate having a plurality of fine hole(s) by using the apparatus shown in FIG. 4. A silicate glass is used, which mainly contains $SiO_2$ and also contains $Al_2O_3$, $B_2O_3$, $Na_2O$ and F, etc., and has a thickness of 0.1 mm. A quartz container is filled with a mixture of silver nitrate and sodium nitrate at a ratio of 50 mol %–50 mol %, as a molten or fused salt.

Then the glass substrate for use in machining is dipped in the molten salt in the quartz container for seventy-two (72) hours. Moreover, the temperature of the molten salt is kept at 300° C. by an electric furnace, and the reacting atmosphere is air.

Measuring the thickness of a layer into which the Ag ions are diffused by an X-ray micro-analyzer, it was found to reach a depth of 200 $\mu$m. The glass, after being ground from one side thereof to obtain a thickness of 0.1 mm, is treated with final finishing grinding. Therefore, the silver concentration gradient in the glass is as described in the claims.

Forming penetrating holes under the same conditions as described with respect to Embodiment 1, the same results can be obtained, i.e., an array of satisfactory penetrating holes can be obtained. In this case, the laser beam may be irradiated from either one of both sides of the glass, i.e., from a high concentration side or a low concentration side. However, on balance, a preferable result is obtained when the laser is irradiated from the high concentration side thereof.

Embodiment 4

Excepting that the ion exchange was conducted for only a very short time of 10 secs, a glass substrate for machining was treated with the ion exchange process under the same conditions as in Embodiment 1, and was further treated with an annealing process at 350° C. for six (6) hours. As a result of this, the silver concentration on the surface having the maximum concentration was decreased to 0.06 mol %. A laser beam was irradiated onto this sample in the same manner as described in Embodiment 1.

As a result, an array of satisfactory penetrating holes was obtained with some of the samples obtained using this process, but cracks and fragmentation occurred with the others.

From Embodiment 4 mentioned above, if there is formed a concentration gradient of the silver in the vicinity of surface of the penetrating hole, it can be ascertained that an array of satisfactory penetrating holes can be obtained even when the silver concentration is low. A lower limit of the concentration is 0.06 mol %. However, only 20–30% of them showed satisfactory results. For obtaining satisfactory penetrating holes with a satisfactory yield, the concentration must be higher than 0.1 mol %.

Figure 8:
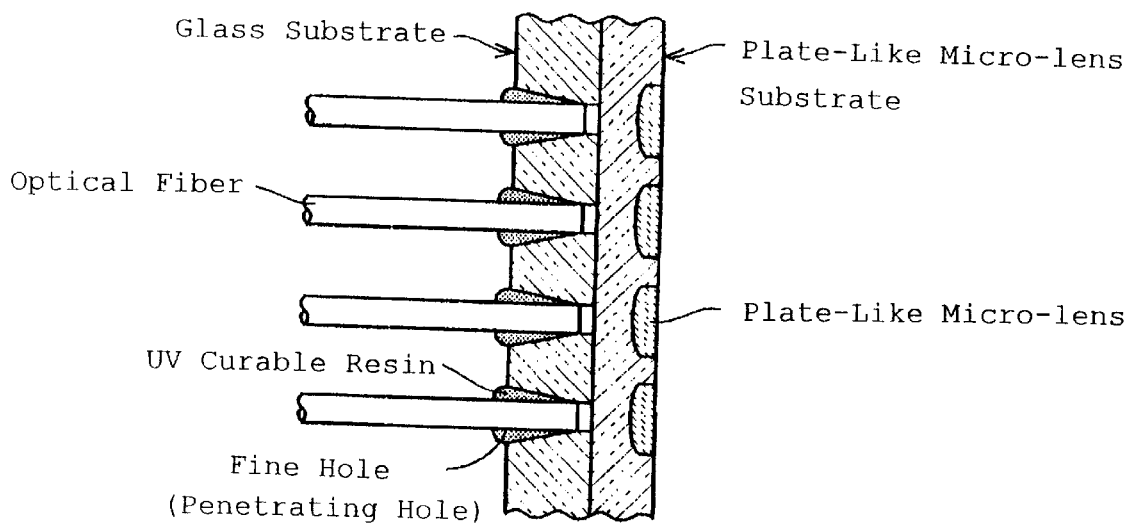
FIG. 8 shows an example of application of the glass substrate of the present invention, in particular applied to a mounting structure of fibers and lenses, in which guide holes are formed in the glass substrate for aligning the fibers in an array.

FIG. 8 shows an example of a product in which penetrating holes are formed in two dimensions, in accordance with the present invention. It is a guide substrate for fixing fiber arrays in two dimensions. Such a construction combined with a plate-like micro-lens is used in the field of optical communication (forming optical fiber interconnections).

As another example, a glass substrate in which penetrating holes are formed in an array can be installed in an ink jet printing device.

Figure 9:
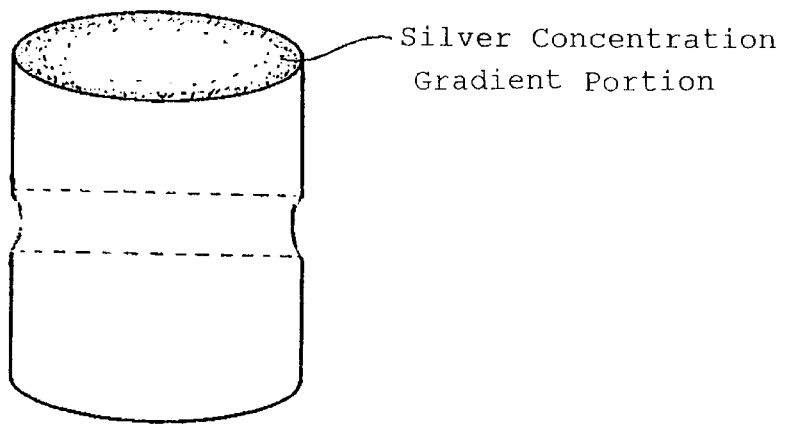
FIGS. 9(a) and 9(b) show an another example of the glass substrate in accordance with the present invention in another configuration.
Figure 9:
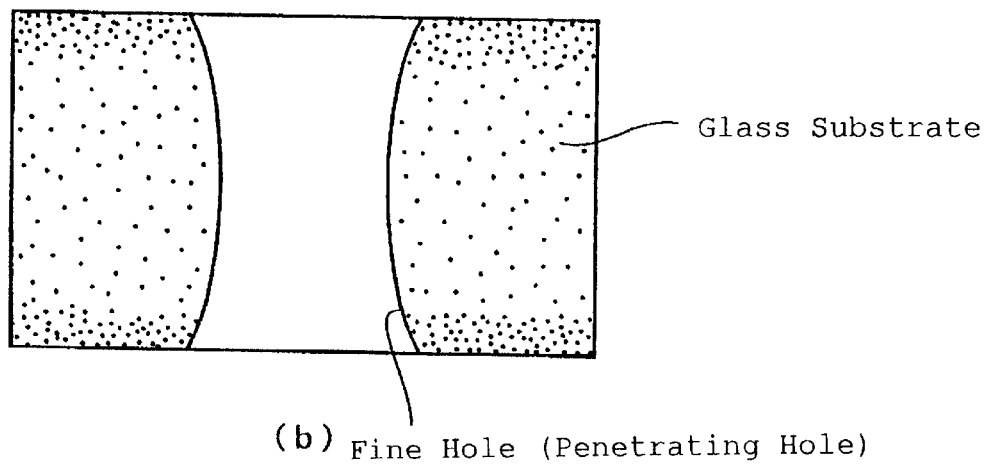

Furthermore, the shape or configuration of the glass substrate is not limited to the plate-like shape, and it can also be formed in a cylindrical or a prism-like shape, as shown in FIG. 9(a). In this case, the concentration gradient of the silver is formed so that it is highest at an external surface of the glass substrate and gradually decreases towards the center thereof. By forming a penetrating hole there, the glass substrate having a fine hole as described in claim 1 can be obtained.

Moreover, the penetrating hole may be formed by providing the glass substrate with a concentration gradient of silver that is a maximum at an external surface of the glass substrate and gradually decreases towards the center thereof, and further, by treating the substrate with the laser machining layer by layer from both external surfaces thereof, as shown in FIG. 9(b).

As is fully explained above, in accordance with the present invention, a glass substrate having at least one fine hole therein in which silver is contained before machining in a form of any one of Ag atoms, Ag colloid or Ag ions, and further a concentration gradient of the silver is a maximum at a surface and gradually decreases until a predetermined depth, is proposed. Alternatively, the silver may be contained throughout the glass substrate as a whole, and further the concentration gradient of the silver may be highest at one surface and gradually decrease until the other surface, or the silver may be contained throughout the glass substrate as a whole and the concentration gradient of the silver is such that, in a direction of thickness, it is lowest at the middle portion thereof and gradually increases towards both surfaces thereof. In this manner, the substrate can be released from thermal stress due to heat when it is processed with machining for forming a hole by using a laser beam, and this processing can be performed by machining from the surface with no cracking nor fragmentation, thereby obtaining a glass substrate having plural satisfactory fine hole(s) formed therein.

Further, by performing microscopic machining on the glass substrate mentioned above by using a laser beam, such microscopic machining can be conducted at room temperature, without losing inherent properties, such as transparency and insulation, and without the necessity of a heating apparatus or a vacuum device.

What is claimed is:

1. A glass substrate having at least one fine hole extending therein, wherein silver is contained in glass at a side surface of said glass substrate, in a form of any one of Ag atoms, Ag colloid or Ag ions, to a predetermined depth from one opening of said one fine hole, wherein a concentration gradient of the silver gradually decreases from said one opening of said one fine hole until the predetermined depth.

2. A glass substrate having at least one fine hole extending therethrough, wherein silver is contained in glass at a side surface of said glass substrate, in a form of any one of Ag atoms, Ag colloid or Ag ions, from one opening of said one fine hole to another opening thereof, wherein a concentration gradient of the silver is a maximum value at said one opening of said one fine hole and a minimum value at said another opening of said one fine hole.

3. A glass substrate having at least one fine hole extending therethrough, wherein silver is contained in glass at a side surface of said glass substrate, in a form of any one of Ag atoms, Ag colloid or Ag ions, from one opening of said one fine hole to another opening thereof, and further a concentration gradient of the silver is a maximum value at both openings of said one fine hole and gradually decreases towards opposite sides thereof.

4. A glass substrate having at least one fine hole therein, as described in claim 1, wherein said glass substrate has a plate-like configuration.

5. A glass substrate having at least one fine hole therein, as described in claim 1, wherein said glass substrate has a cylinder-like configuration.

6. A glass substrate having at least one fine hole therein, as described in claim 1, wherein said glass substrate is made of silicate glass mainly containing $SiO_2$.

7. A glass substrate having at least one fine hole therein, as described in claim 1, wherein a plurality of the fine holes are aligned in one dimension or two dimensions.

8. A glass substrate having at least one fine hole therein, as described in claim 1, wherein said fine hole has a diameter within a range from 10 $\mu$m to 300 $\mu$m.

9. A glass substrate having at least one fine hole therein, as described in claim 1, wherein the maximum concentration of silver is greater than 0.1 mol %.

10. A glass substrate having at least one fine hole therein, as described in claim 2, wherein said glass substrate has a plate-like configuration.

11. A glass substrate having at least one fine hole therein, as described in claim 2, where said glass substrate has a cylinder-like configuration.

12. A glass substrate having at least one fine hole therein, as described in claim 2, wherein said glass substrate is made of silicate glass mainly containing $SiO_2$.

13. A glass substrate having at least one fine hole therein, as described in claim 2, wherein a plurality of the fine holes are aligned in one dimension or two dimensions.

14. A glass substrate having at least one fine hole therein, as described in claim 2, wherein said fine hole has a diameter within a range from 10 $\mu$m to 300 $\mu$m.

15. A glass substrate having at least one fine hole therein, as described in claim 2, wherein the maximum concentration of silver is greater than 0.1 mol %.

16. A glass substrate having at least one fine hole therein, as described in claim 3, wherein said glass substrate has a plate-like configuration.

17. A glass substrate having at least one fine hole therein, as described in claim 3, where said glass substrate has a cylinder-like configuration.

18. A glass substrate having at least one fine hole therein, as described in claim 3, wherein said glass substrate is made of silicate glass mainly containing $SiO_2$.

19. A glass substrate having at least one fine hole therein, as described in claim 3, wherein a plurality of the fine holes are aligned in one dimension or two dimensions.

20. A glass substrate having at least one fine hole therein, as described in claim 3, wherein said fine hole has a diameter within a range from 10 $\mu$m to 300 $\mu$m.

21. A glass substrate having at least one fine hole therein, as described in claim 3, wherein the maximum concentration of silver is greater than 0.1 mol %.

* * * * *